(12) United States Patent
Idani

(10) Patent No.: US 8,496,758 B2
(45) Date of Patent: Jul. 30, 2013

(54) CLEANING APPARATUS AND CLEANING METHOD FOR WAFER

(75) Inventor: Naoki Idani, Kawasaki (JP)

(73) Assignee: Fujitsu Semiconductor Limited, Yokohama (JP)

( * ) Notice: Subject to any disclaimer, the term of this patent is extended or adjusted under 35 U.S.C. 154(b) by 0 days.

(21) Appl. No.: 13/032,817

(22) Filed: Feb. 23, 2011

(65) Prior Publication Data

US 2011/0138553 A1 Jun. 16, 2011

Related U.S. Application Data

(62) Division of application No. 11/411,874, filed on Apr. 27, 2006, now Pat. No. 7,908,698.

(30) Foreign Application Priority Data

Jan. 17, 2006 (JP) .................................. 2006-008323

(51) Int. Cl.
*B08B 7/00* (2006.01)

(52) U.S. Cl.
USPC .......... 134/6; 134/2; 15/88.2; 15/88.3; 15/77; 15/102

(58) Field of Classification Search
USPC ............... 134/2, 6; 15/88.3, 27, 88.2, 77, 102
See application file for complete search history.

(56) References Cited

U.S. PATENT DOCUMENTS

| | | | | |
|---|---|---|---|---|
| 6,167,583 | B1 * | 1/2001 | Miyashita et al. | 15/77 |
| 6,551,410 | B2 * | 4/2003 | Crevasse et al. | 134/6 |
| 6,733,596 | B1 * | 5/2004 | Mikhaylichenko et al. | 134/6 |
| 7,162,765 | B2 * | 1/2007 | Harbison et al. | 15/77 |
| 7,435,302 | B2 * | 10/2008 | Takahara et al. | 134/6 |
| 8,356,376 | B2 * | 1/2013 | Mouri et al. | 15/77 |
| 2005/0015903 | A1 * | 1/2005 | Harbison et al. | 15/77 |
| 2005/0067104 | A1 * | 3/2005 | Takahara et al. | 156/345.54 |

FOREIGN PATENT DOCUMENTS

| | | |
|---|---|---|
| JP | 4-111387 A | 4/1992 |
| JP | 10-321572 A | 12/1998 |
| JP | 11-283952 A | 10/1999 |
| JP | 2002-096038 | 4/2002 |
| JP | 2003-163196 | 6/2003 |

OTHER PUBLICATIONS

"Japanese Office Action", partial English Translation, mailed Dec. 21, 2010 for corresponding Japanese Application No. 2006-008323.
"Japanese Office Action", mailed by JPO and corresponding to Japanese application No. 2006-008323 on Apr. 20, 2010.

(Continued)

*Primary Examiner* — Michael Kornakov
*Assistant Examiner* — Katelyn Whatley
(74) *Attorney, Agent, or Firm* — Fujitsu Patent Center

(57) ABSTRACT

A front surface of the wafer is contacted with a straight-shaped front surface cleaning brush, and a pressure is applied on the front surface cleaning brush from both ends to enlarge the diameters in both end portions of the front surface cleaning brush. The front surface cleaning brush rotates with a shaft being an axis. An inner surface of the front surface cleaning brush is directly in contact with a surface of the shaft. The front surface cleaning brush is composed of a single structure made of synthetic resin.

7 Claims, 11 Drawing Sheets

OTHER PUBLICATIONS

Naoki Idani, Evaluation Method of CMP Slurry Pollution, pp. 36-38, Clean Technology, vol. 8, No. 5, May 1998, Japan Industrial Publishing Co., Ltd., Tokyo, Japan.
USPTO, [DEO] "U.S. Appl. No. 11/411,874 (parent)," [CTRS] Requirement for Restriction/Election issued on May 14, 2009.
USPTO, [KARLS] "U.S. Appl. No. 11/411,874 (parent)," [CTNF] Non-Final Office Action issued on Sep. 22, 2009.
USPTO, [KARLS] "U.S. Appl. No. 11/411,874 (parent)," [CTFR] Final Office Action issued on Jun. 14, 2010.
USPTO, [KARLS] "U.S. Appl. No. 11/411,874 (parent)," [NOA] Notice of Allowance and Fees Due issued on Nov. 16, 2010.
USPTO, [KARLS] "U.S. Appl. No. 11/411,874 (parent)," [NOA] Supplemental Notice of Allowability issued on Jan. 6, 2011.

* cited by examiner

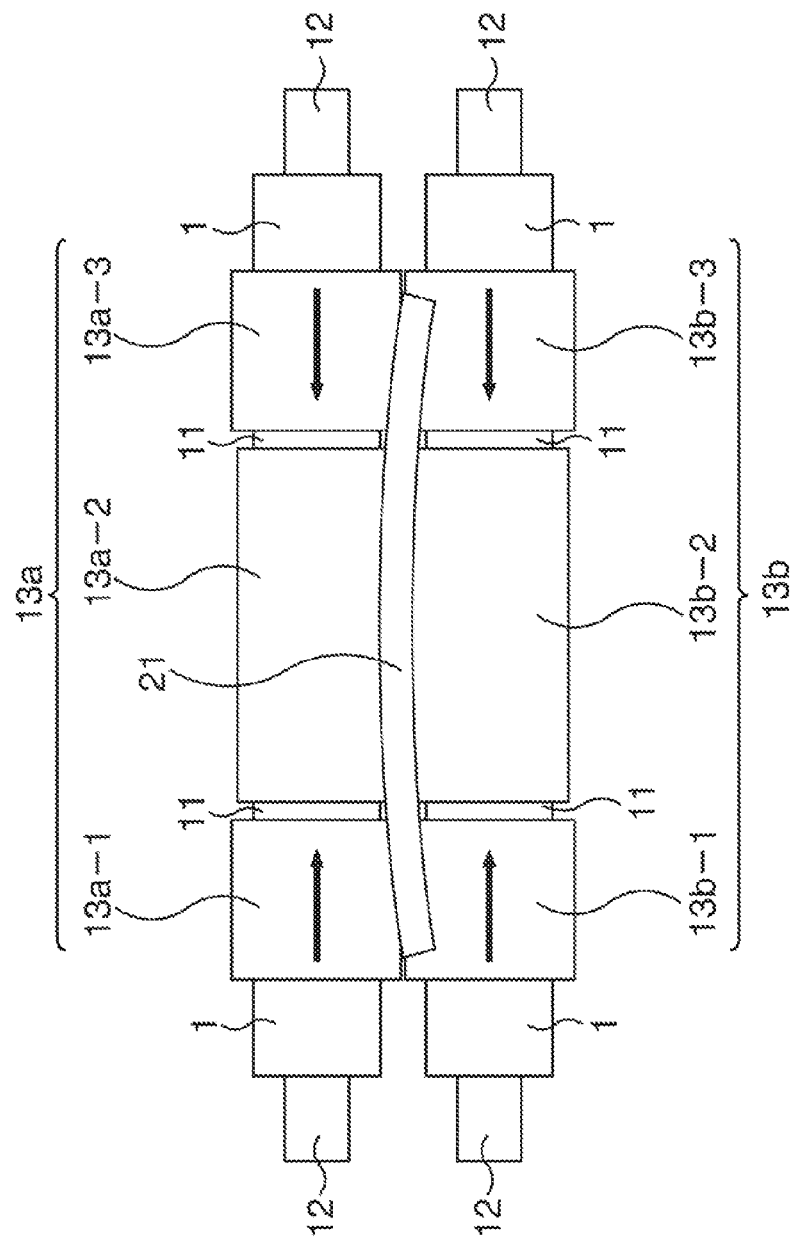

CLEANING APPARATUS AND CLEANING METHOD FOR WAFER

CROSS-REFERENCE TO RELATED APPLICATIONS

This application is a divisional of application Ser. No. 11/411,874, filed Apr. 27, 2006, (which issued as U.S. Pat. No. 7,908,698 on Mar. 22, 2011) which claims priority of Japanese Patent Application No. 2006-008323, filed on Jan. 17, 2006, the entire contents of which are incorporated by reference.

BACKGROUND OF THE INVENTION

1. Field of the Invention

The present invention relates to a cleaning apparatus and a cleaning method for a wafer preferable for manufacturing a semiconductor device.

2. Description of the Related Art

Recently, in a manufacturing process of a semiconductor device, it is becoming essential to planarize a film or the like having been formed by that time by performing a CMP (Chemical Mechanical Polishing) processing before a photolithography, in order to secure an exposure margin for the photolithography. Here, a method of planarization by the CMP processing will be described with reference to FIG. 10. FIG. 10 is a schematic view showing an outline of a CMP apparatus.

The CMP apparatus is provided with a polishing table 51 on a surface of which a polishing pad 52 is affixed, a polishing head 54 holding a wafer 53, and a slurry supplying nozzle 55 supplying slurry (suspension containing a grain of abrasive) 56. Further, the CMP apparatus is provided with a dressing apparatus 57 dressing the polishing pad 52. The polishing table 51 and the polishing pad 52 are rotatable around their own axes.

In a CMP processing using the CMP apparatus with such a constitution, the slurry 56 is supplied from the slurry supplying nozzle 55 onto the polishing pad 52 while the polishing table 51 is being rotated, and the wafer 53 is pressed on the polishing pad 52 while the polishing head 54 is being rotated. As a consequence, the wafer 53 is polished by the polishing pad 52. To a portion of the polishing pad 52 which is squashed due to the wafer 53 being pressed on, a dressing is performed by the dressing apparatus 57 during rotation.

The CMP processing is performed as above, and the abrasive grain contained in the slurry, metal impurity, or the like remain on the wafer 53 after the CMP processing. Thus, a cleaning of the wafer 53 is required after the CMP processing. Here, a conventional cleaning method of a wafer will be described with reference to FIG. 11 and FIG. 12. FIG. 11 is a perspective view showing a conventional cleaning apparatus, while FIG. 12 is a front view showing the conventional cleaning apparatus.

The conventional cleaning apparatus is provided with two cylindrical brushes 63 contacting a front surface and a rear surface of the wafer 53, respectively. The brush 63 is made of synthetic resin and a plurality of projections are formed on a surface thereof. Additionally, a shaft 62 is inserted into the brush 63. In a cleaning using this apparatus, the brushes 63 and the wafer 53 are rotated while the two brushes 63 are made to contact the front surface and the rear surface of the wafer 53.

It is also carried out that a plurality of such cleaning apparatuses are provided to perform cleanings using different cleaning solutions. For example, after a cleaning is performed with an ammonia solution being supplied, another cleaning may be performed with a fluorinate acid being supplied. By this method, the abrasive grain is removed by the cleaning using the ammonia solution and the metal impurity is removed by the cleaning using the fluorinated acid.

By these methods, a sufficient cleaning is possible for a wafer with a diameter of 200 mm or less. However, when the cleaning is performed for a wafer with a diameter of about 300 mm according to the above-described method, numerous foreign objects 58 remain on an outer peripheral portion of the wafer 53 as shown in FIG. 13. This is considered because times during which a central portion and the peripheral portion of the wafer 53 contact the brush 63 are different. That is, in the peripheral portion, time during which the wafer is apart from the brush 63 is relatively long and a cleaning efficiency is deteriorated.

Thus, there is disclosed an art in which a brush having larger diameters in both ends is used to increase the cleaning efficiency in the outer peripheral portion (Patent Document 1).

However, using the brush having the larger diameters in the both ends is not practical. This is because a variation of the diameter of the brush must be adjusted in response to the diameter of the wafer. Moreover, since a direction and an amount of a warp of the wafer vary in response to a kind, a number, and a pattern and the like of films already formed, it is required to prepare more various brushes in order to correspond also thereto.

For example, in such a case as after a CMP processing for forming an element isolation region by STI (Shallow Trench Isolation), the wafer 53 is warped into a shape of a mound as shown in FIG. 14A. As a result, on the front surface of the wafer 53 the outer peripheral portion is hard to contact the brush 63. On the other hand, in such a case as after a CMP processing for forming a metal wiring, the wafer 53 warps into a shape of a bowl as shown in FIG. 14B. As a result, on the front surface of the wafer 53 the outer peripheral portion is easy to contact the brush 63, while on the rear surface the outer peripheral portion is hard to contact the brush 63. Therefore, unless brushes of a plurality of kinds are prepared for the same wafer, foreign objects on the front surface and the rear surface of the wafer 53 cannot be removed sufficiently. Additionally, not only the direction of the warp but also the amount of the warp varies in response to a film forming condition or the like as described above.

As described above, in the conventional method in which the brush with the varied diameter is used, it is required to prepare various brushes, resulting in a higher cost.

Though it is possible to remove the foreign objects using conventional brushes if the cleaning is performed for a long period of time, a time period of at least about three to four times of a time period required for the cleaning of the wafer with the diameter of about 200 mm is necessary. As a result, a throughput is substantially decreased.

Related arts are disclosed in Patent Document 1 (Japanese Patent Application Laid-open No. 2003-163196) and in Non-patent Document 1 (Clean Technology VOL. 8, No. 5 (May 1998)).

SUMMARY OF THE INVENTION

It is an object of the present invention to provide a cleaning apparatus and cleaning method for a wafer which are capable of reliably cleaning various wafers without using various kinds of brushes.

In order to solve the above problem, the present inventor has devised embodiments of the present invention described below as a result of acute study.

A cleaning apparatus for the wafer according to the present invention is provided with a straight-shaped front surface cleaning brush contacting a front surface of the wafer, and a pressurizer enlarging diameters in both end portions of the front surface cleaning brush by means of applying a pressure on the front surface cleaning brush from both ends.

In a cleaning method for the wafer according to the present invention, a straight-shaped front surface cleaning brush is made to contact a surface of the wafer, and diameters in both end portions of the front surface cleaning brush is enlarged by means of applying a pressure on the front surface cleaning brush from both ends.

BRIEF DESCRIPTION OF THE DRAWINGS

FIG. 9 is a view showing an operation of the second embodiment of the present invention;

DETAILED DESCRIPTION OF THE PREFERRED EMBODIMENTS

Hereinafter, embodiments of the present invention will be described concretely with reference to the attached drawings.

First Embodiment

Figure 1A:
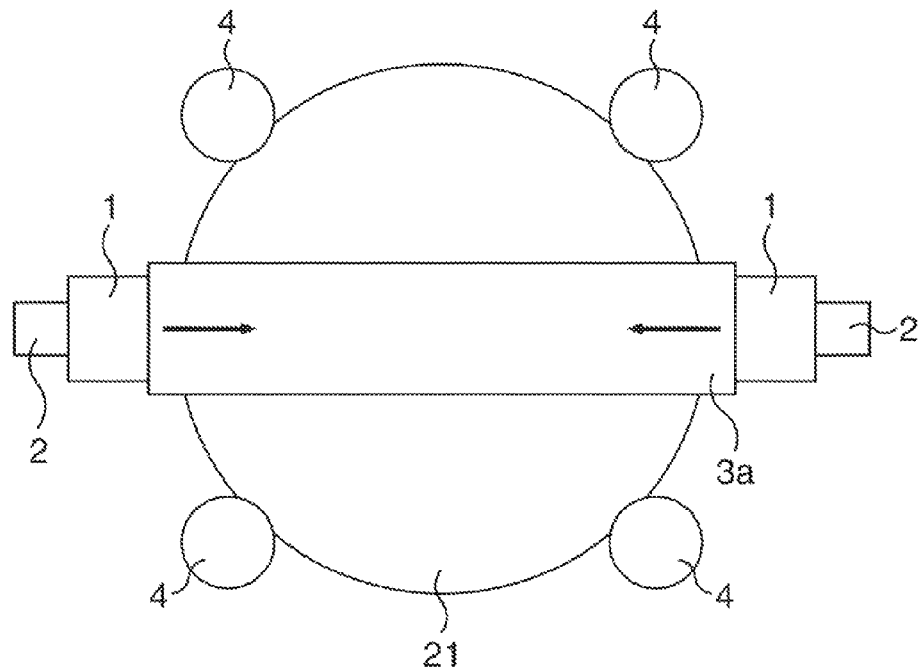
FIG. 1A is a top view showing a cleaning apparatus for a wafer according to a first embodiment of the present invention.
Figure 1B:
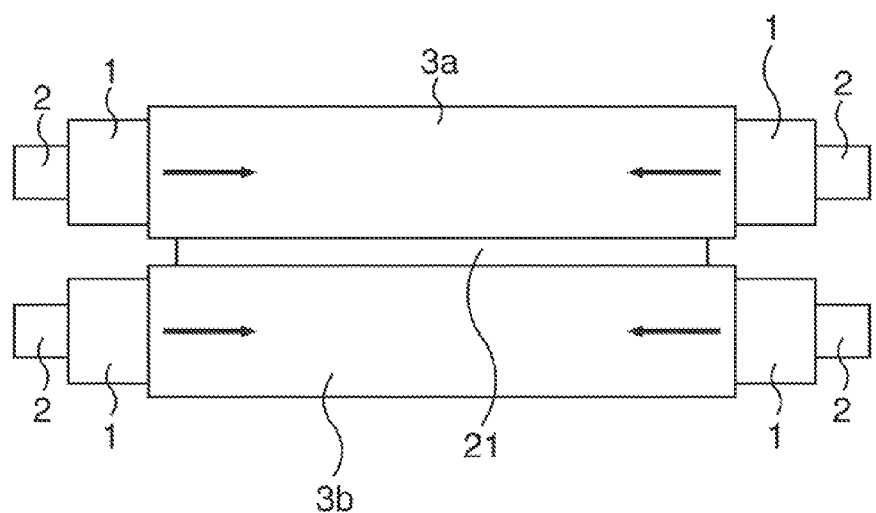
FIG. 1B is a front view showing the cleaning apparatus for a wafer according to the first embodiment of the present invention.
Figure 1C:
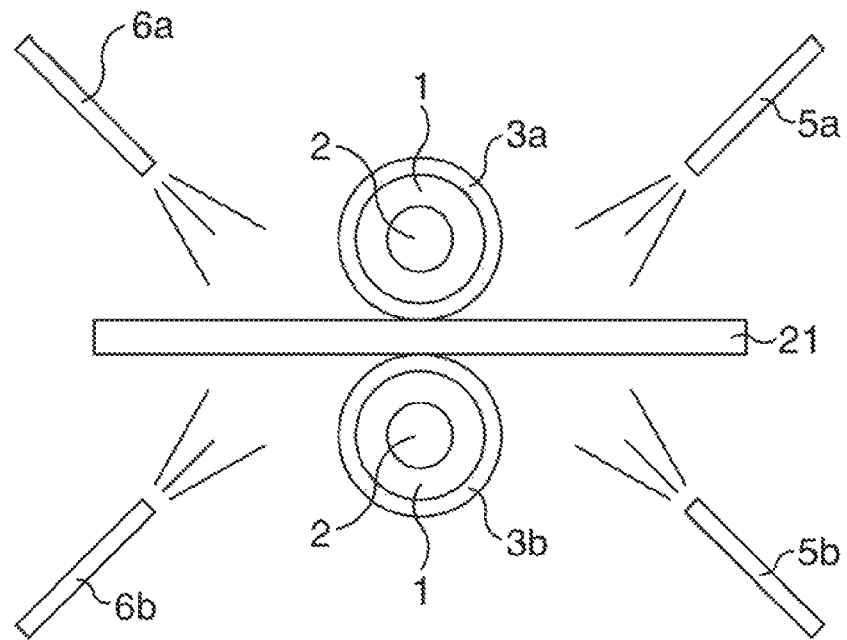
FIG. 1C is a side view showing the cleaning apparatus for a wafer according to the first embodiment of the present invention.

To begin with, a first embodiment of the present invention will be described. FIG. 1A is a top view showing a cleaning apparatus for a wafer according to the first embodiment of the present invention. FIG. 1B is a front view showing the cleaning apparatus for the wafer according to the first embodiment of the present invention. FIG. 1C is a side view showing the cleaning apparatus for the wafer according to the first embodiment of the present invention.

Figure 2:
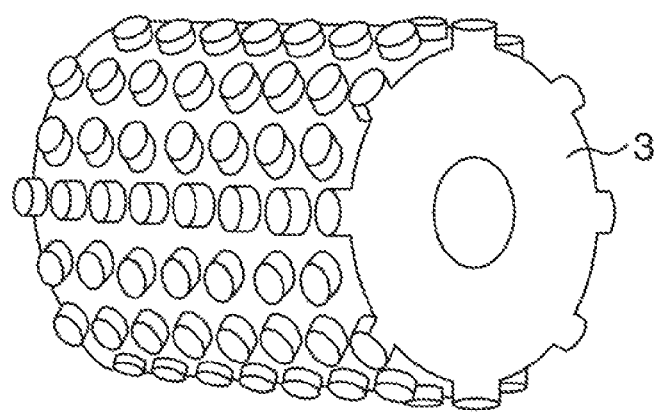
FIG. 2 is a view showing a brush 3.

In the first embodiment, there are provided a cylindrical front surface cleaning brush 3a and a cylindrical rear surface cleaning brush 3b which contact a front surface and a rear surface of a wafer 21 respectively, as shown in FIG. 1A to FIG. 1C. Hereinafter, the front surface cleaning brush 3a and the rear surface cleaning brush 3b may be referred to generically as brushes 3. The brushes 3 are made of synthetic resin such as PVA (Poly Vinyl Alcohol), for example, on surfaces of which a plurality of projections are formed as shown in FIG. 2. A diameter of the projection is, for example, about 5 mm. Shafts 2 are inserted to the brushes 3. Each brush 3 can be rotated with the shaft 2 being an axis. Additionally, rollers 4 rotating the wafer 21 are provided. Further, there are disposed a pure water nozzle 5a spraying a pure water to the front surface of the wafer 21, a pure water nozzle 5b spraying a pure water to the rear surface, a chemical nozzle 6a spraying a chemical solution (cleaning agent) to the front surface, and a chemical nozzle 6b spraying a chemical solution (cleaning agent) to the rear surface. Incidentally, instead of using these nozzles, a communication path for liquid may be provided inside the brush 3 so that the pure water and the chemical solution are supplied from inside the brush 3.

Further, in the present embodiment, along a direction in which the shaft 2 extends, there are provided pressure portions 1 which apply pressures on the brush 3 from both ends thereof. The pressure portion 1 is constituted using a pressure mechanism by a diaphragm system, for example. When the pressure portions 1 apply the pressures on the brush 3, both side portions of the brush 3 are compressed and the diameters thereof become large in the both end portions.

Figure 3:
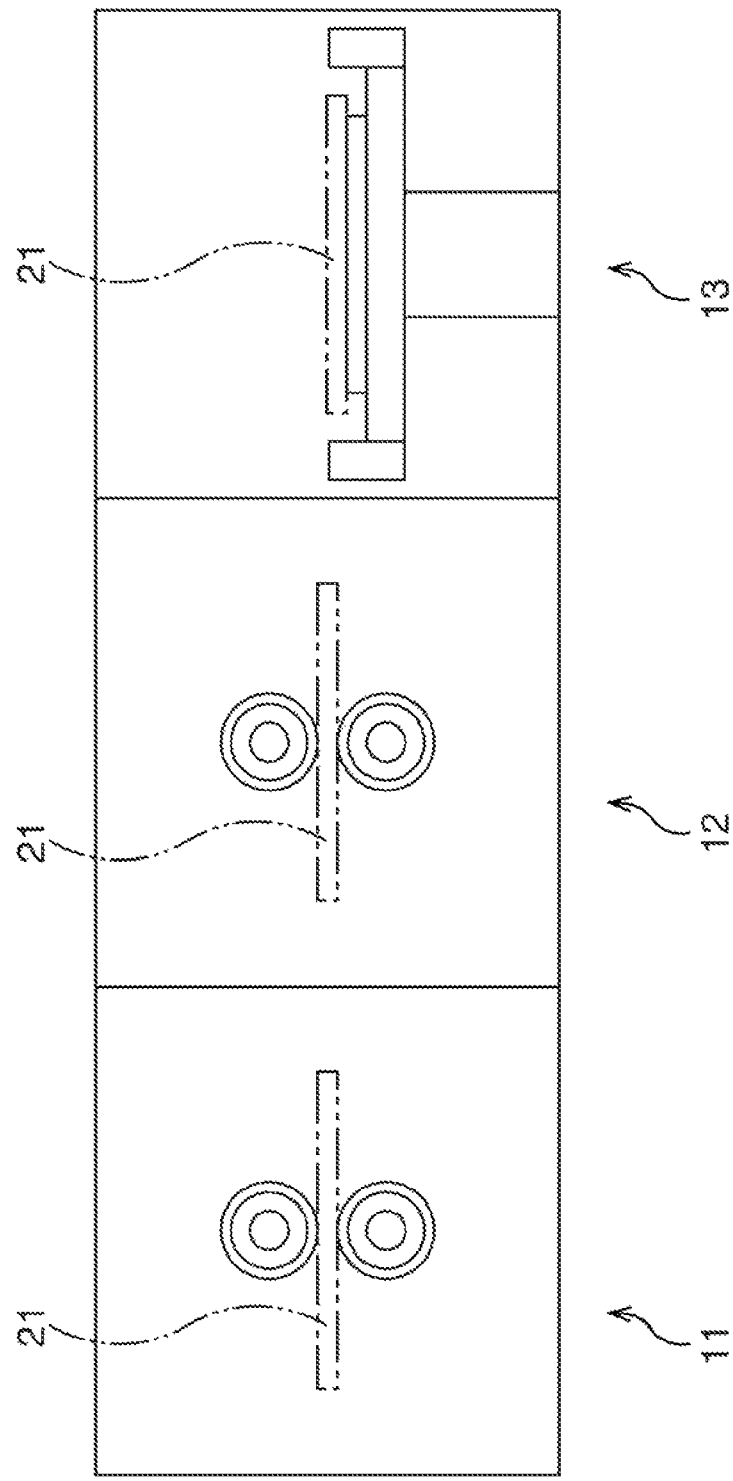
FIG. 3 is a view showing a cleaning system for a wafer.

In a cleaning system including the cleaning apparatus according to the first embodiment, as shown in FIG. 3 for example, there are provided a first brush unit 11 and a second brush unit 12 which include the cleaning apparatuses respectively, and further, a cleaning/drying unit 13 is provided in a subsequent step. In the first brush unit 11, a cleaning agent of alkali or the like which is capable of removing abrasive grain is sprayed from the nozzles 5a and 5b. On the other hand, in the second brush unit 12, a cleaning agent of acid or the like which is capable of removing metal impurity is sprayed from the nozzles 5a and 5b. For example, an ammonia solution is sprayed from the nozzles 5a and 5b of the first brush unit 11, while a hydrofluoric acid is sprayed from the nozzles 5a and 5b of the second brush unit 12. Additionally, in the cleaning/drying unit 13, a pure water is supplied to rinse the wafer 21 while the wafer 21 is being rotated, and a drying is performed by high-speed rotation.

Here, a cleaning method using the cleaning system constituted as above will be described.

First, the wafer 21 on which the CMP processing is completed is conveyed to the first brush unit 11, and the wafer 21 is held by the rollers 4. Next, the wafer 21 is rotated by rotating the rollers 4. Rotation speed at this time is not specifically limited, but is 50 rotations per minute, for example. Next, while the front surface cleaning brush 3a and the rear surface cleaning brush 3b are being rotated, they are made to contact both surfaces of the wafer 21. Rotation speed at this time is not specifically limited, but is 200 rotations per minute, for example.

Incidentally, it is preferable that the pure water is supplied to the wafer 21 from the pure water nozzles 5a and 5b during the period from a holding of the wafer 21 by the rollers 4 to startings of the rotation of the wafer 21 and the rotation of the brush 3 so that the wafer 21 does not become dry.

Figure 4:
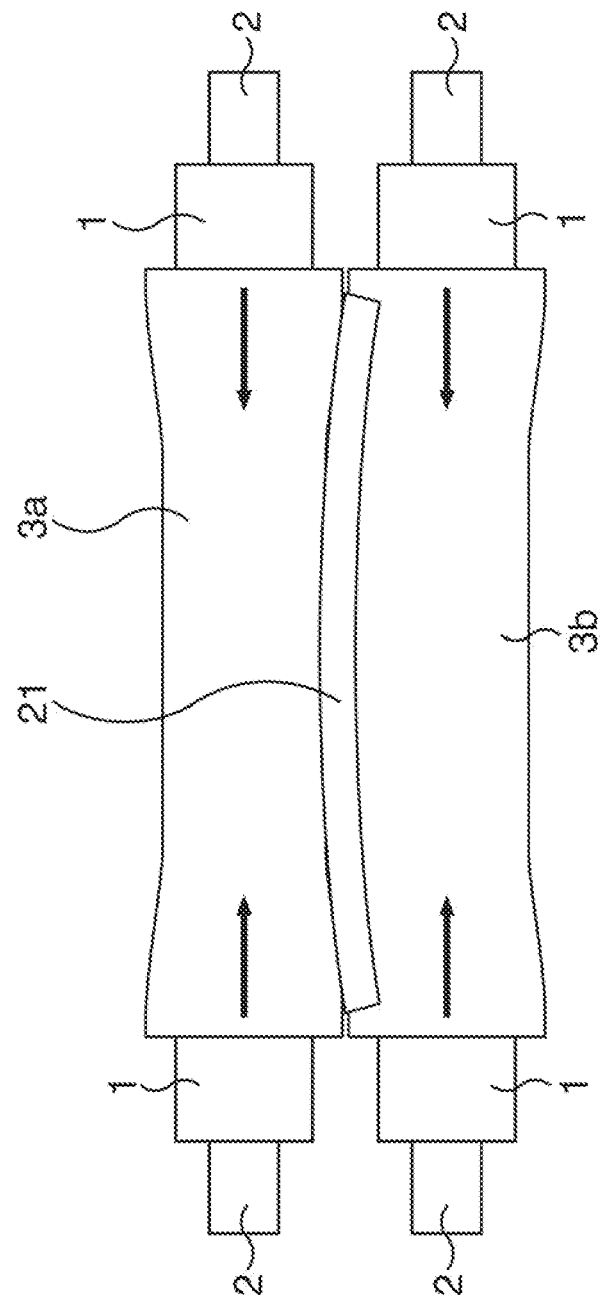
FIG. 4 is a view showing an operation of the first embodiment of the present invention.

After the front surface cleaning brush 3a and the rear surface cleaning brush 3b are made to contact the wafer 21, the both end portions of the front surface cleaning brush 3a and the rear surface cleaning brush 3b are deformed by means of pressurizing the both ends of the front surface cleaning brush 3a and the rear surface cleaning brush 3b by the pressure portions 1. That is, the both end portions of the front surface cleaning brush 3a and the rear surface cleaning brush 3b are compressed so that the diameters in the both end portions are enlarged as shown in FIG. 4. As a consequence, the entire front surface of the wafer 21 is made to contact the front surface cleaning brush 3a substantially evenly, even if the wafer 21 is warped into a shape of a mound. Therefore, a cleaning efficiency of the outer peripheral portion of the wafer 21 improves. Incidentally, a magnitude of the pressure applied by the pressure portions 1 is not specifically limited, but is about 0.1 kgw/cm$^2$, for example.

While the front surface cleaning brush 3a and the rear surface cleaning brush 3b are being rotated in contact with the wafer 21, an alkaline chemical solution is supplied to the wafer 21 from the chemical nozzles 6a and 6b. A composition of the alkaline chemical solution is not specifically limited, but an ammonia solution of about 0.5 weight percent, for example, is used. Also, supplying time is not specifically limited, but is about 30 seconds, for example.

The foreign objects such as abrasive grain on the front surface and the rear surface of the wafer 21 are removed by means of such rotation, pressurizing, and supplying of the chemical solution.

After a brush cleaning is performed for a predetermined time, the front surface cleaning brush 3a and the rear surface cleaning brush 3b are separated from the wafer 21 and the rotation is halted. Then, the pure water is supplied to the wafer 21 from the pure water nozzles 5a and 5b to rinse the front surface and the rear surface of the wafer 21.

Subsequently, the wafer 21 is conveyed to the second brush unit 12 and the wafer 21 is held by the rollers 4. Next, the wafer 21 is rotated by rotating the rollers 4. Rotation speed at this time is not specifically limited, but is 50 rotations per minute, for example.

Next, an acid chemical solution is supplied to the wafer 21 from the chemical nozzles 6a and 6b. A composition of the acid chemical solution is not specifically limited, but a hydrofluoric acid of about 0.5 weight percent, for example, is used. Also, supplying time is not specifically limited, but is about 10 seconds, for example.

Incidentally, during the cleaning using the acid chemical solution, the front surface cleaning brush 3a and the rear surface cleaning brush 3b may be made to contact the both surfaces of the wafer 21 while being rotated, similarly to the brush cleaning in the first brush unit 11. Rotation speed at this time is not specifically limited, but is 200 rotations per minute, for example. It is preferable that the pure water is supplied to the wafer 21 from the pure water nozzles 5a and 5b during the period from a holding of the wafer 21 by the rollers 4 to startings of the rotation of the wafer 21 and the rotation of the brush 3 so that the wafer 21 does not become dry.

Further, after the front surface cleaning brush 3a and the rear surface cleaning brush 3b are made to contact the wafer 21, the both end portions of the front surface cleaning brush 3a and the rear surface cleaning brush 3b are deformed by means of pressurizing the both ends of the front surface cleaning brush 3a and the rear surface cleaning brush 3b by the pressure portions 1, similarly to the brush cleaning in the first brush unit 11. That is, the both end portions of the front surface cleaning brush 3a and the rear surface cleaning brush 3b are compressed so that the diameters in the both end portions are enlarged as shown in FIG. 4. Incidentally, a magnitude of the pressure applied by the pressure portions 1 is not specifically limited, but is about 0.1 kgw/cm$^2$, for example. The pressurizing may be started during the period in which the front surface cleaning brush 3a and the rear surface cleaning brush 3b are being moved to contact the wafer 21. That is, timing to start the pressurizing is not limited to after the front surface cleaning brush 3a and the rear surface cleaning brush 3b are made to contact the wafer 21.

After the cleaning for a predetermined time using the acid chemical solution, supplying of the acid from the nozzles 6a and 6b is stopped. Then, the pure water is supplied to the wafer 21 from the pure water nozzles 5a and 5b, to rinse the front surface and the rear surface of the wafer 21.

Subsequently, the wafer 21 is conveyed to the cleaning/drying unit 13 and the wafer 21 is mounted on a rotatable stage. Then, the wafer 21 is rinsed with a pure water while being rotated at high speed. Subsequently, the wafer 21 is dried.

According to such a cleaning method using the cleaning apparatus according to the first embodiment, at the time of the brush cleaning, the front surface cleaning brush 3a and the rear surface cleaning brush 3b are compressed and deformed to become easy to contact the outer peripheral portion of the wafer 21. Therefore, a high cleaning efficiency is achieved. Additionally, since conventional brushes can be used as the front surface cleaning brush 3a and the rear surface cleaning brush 3b, a cost increase can also be suppressed.

Figure 5:
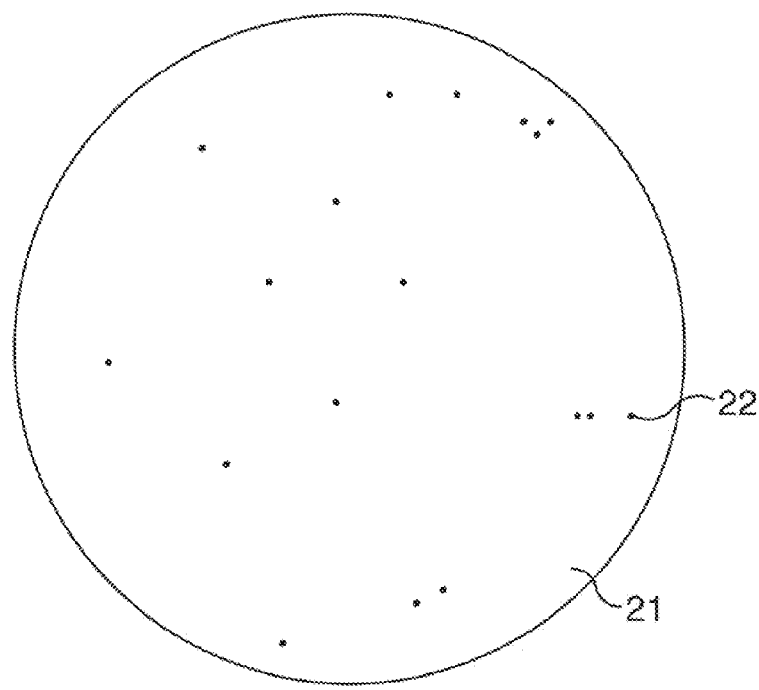
FIG. 5 is a view showing a result of an observation (in a case in which a pressurizing is performed) actually carried out.

Here, results of an observation actually carried out by the present inventor will be described. In this observation, an oxide film of 500 nm in thickness is formed on a silicon wafer. Then, the oxide film is polished to be 250 nm by a CMP processing and a foreign object (defect) on a wafer surface is measured using a wafer surface examining apparatus (LS6800 of Hitachi High-Technologies Corporation). The result of a case in which both end portions of the front surface cleaning brush 3a and the rear surface cleaning brush 3b are pressurized is shown in FIG. 5 while the result of a case in which the both end portions are not pressurized is shown in FIG. 6.

Figure 6:
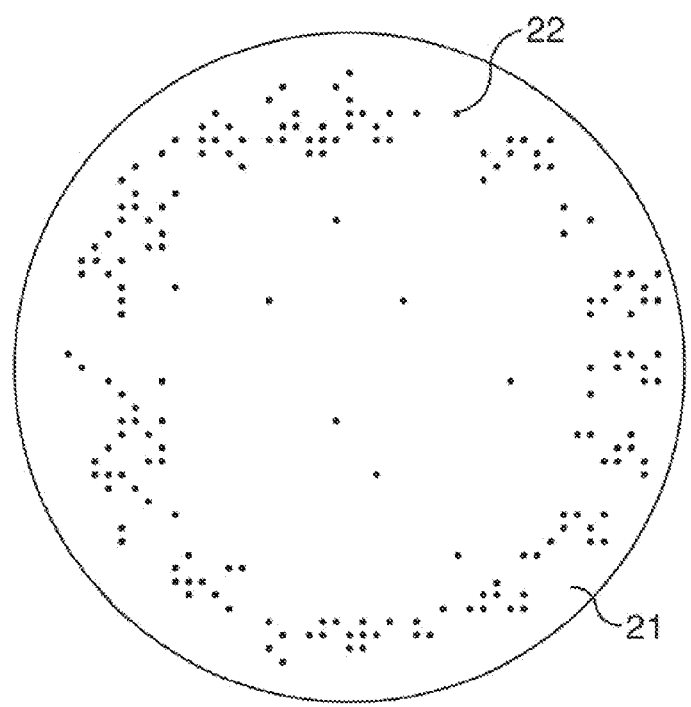
FIG. 6 is a view showing a result of the observation (in a case in which the pressurizing is not performed) actually carried out.

As shown in FIG. 6, when the both end portions of the front surface cleaning brush 3a and the rear surface cleaning brush 3b are not pressurized, numerous foreign objects 22 exist in the outer peripheral portion of the wafer 21. On the other hand, as shown in FIG. 5, when the both end portions of the front surface cleaning brush 3a and the rear surface cleaning brush 3b are pressurized, the foreign objects 22 scarcely exist over the entire surface of the wafer 21.

Incidentally, the pressures applied on the front surface cleaning brush 3a and the rear surface cleaning brush 3b by the pressure portions 1 may be differentiated from each other. For example, as shown in FIG. 4, when the wafer 21 is warped into the shape of the mound, the pressure applied on the rear surface cleaning brush 3b may be smaller than the pressure applied on the front surface cleaning brush 3a, or only the front surface cleaning brush 3a may be compressed. In contrast, when the wafer 21 is warped into a shape of a bowl, the pressure applied on the front surface cleaning brush 3a may be smaller than the pressure applied on the rear surface cleaning brush 3b, or only the rear surface cleaning brush 3b may be compressed.

Second Embodiment

Figure 7:
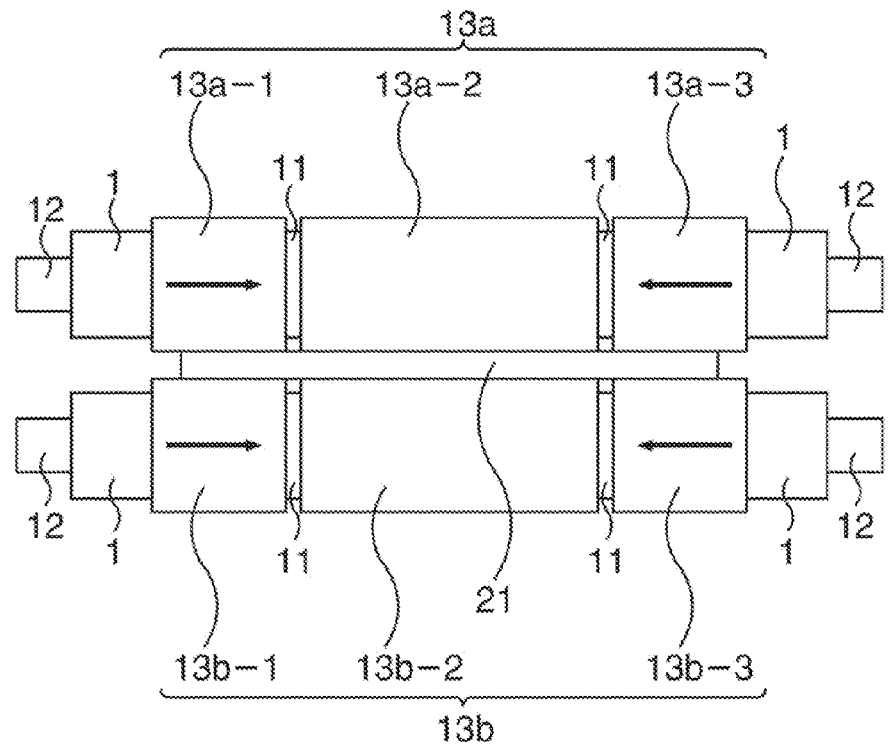
FIG. 7 is a front view showing a cleaning apparatus for a wafer according to a second embodiment of the present invention.

Next, a second embodiment of the present invention will be described. FIG. 7 is a front view showing a cleaning apparatus for a wafer according to the second embodiment of the present invention.

Figure 8A:
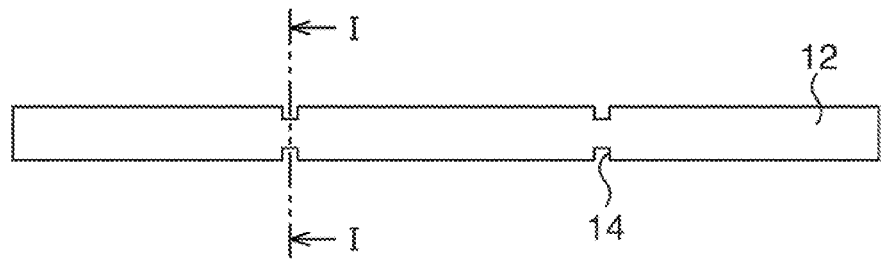
FIG. 8A is a view showing a shaft 12.
Figure 8B:
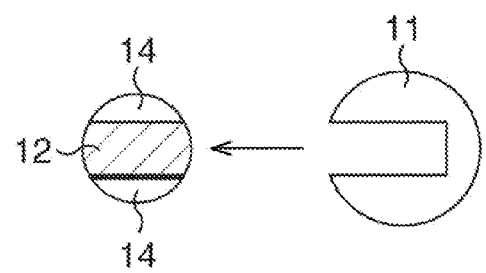
FIG. 8B is a view showing a cross section along a line I-I in FIG. 8A and a stopper 11.
Figure 10:
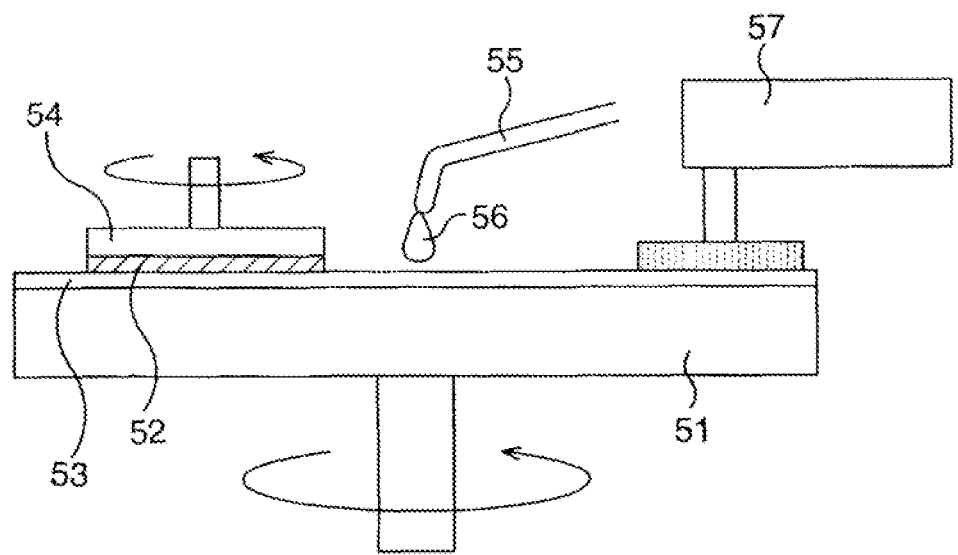
FIG. 10 is a view showing a planarization method by a CMP processing.
Figure 11:
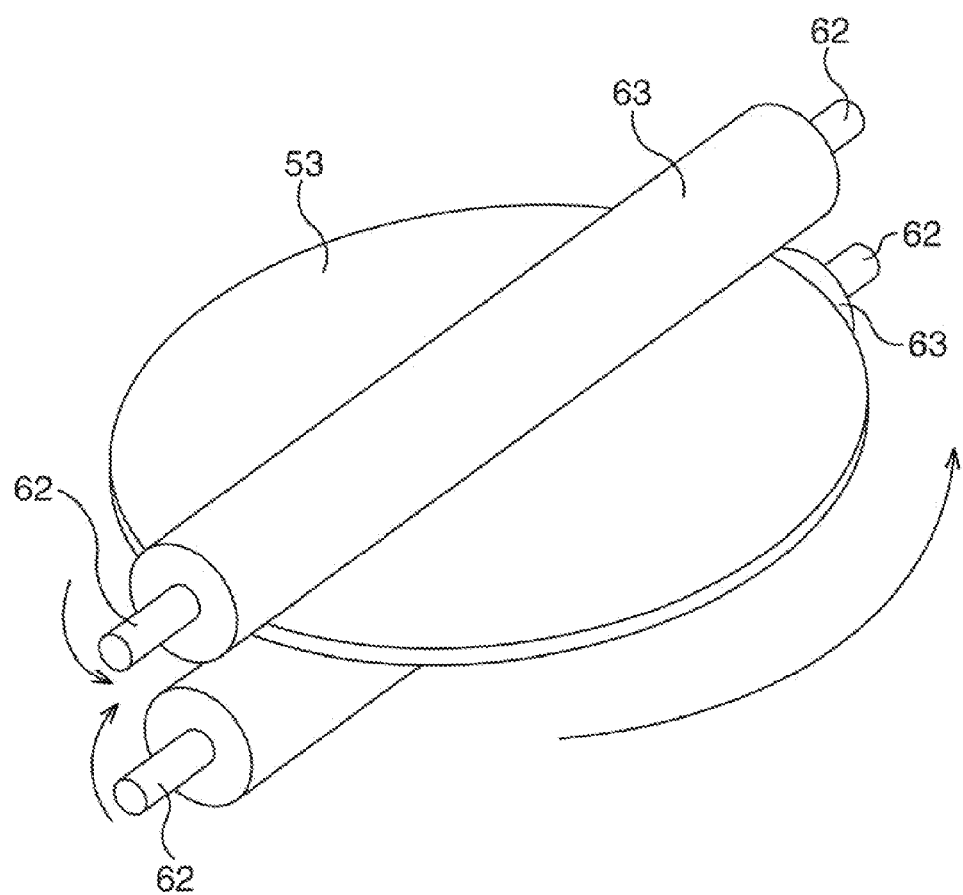
FIG. 11 is a perspective view showing a conventional cleaning apparatus.
Figure 12:
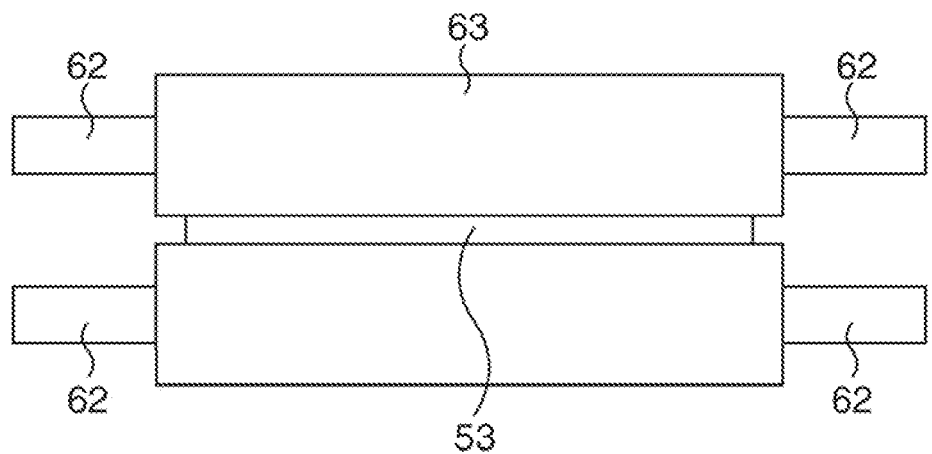
FIG. 12 is a front view showing the conventional cleaning apparatus.
Figure 13:
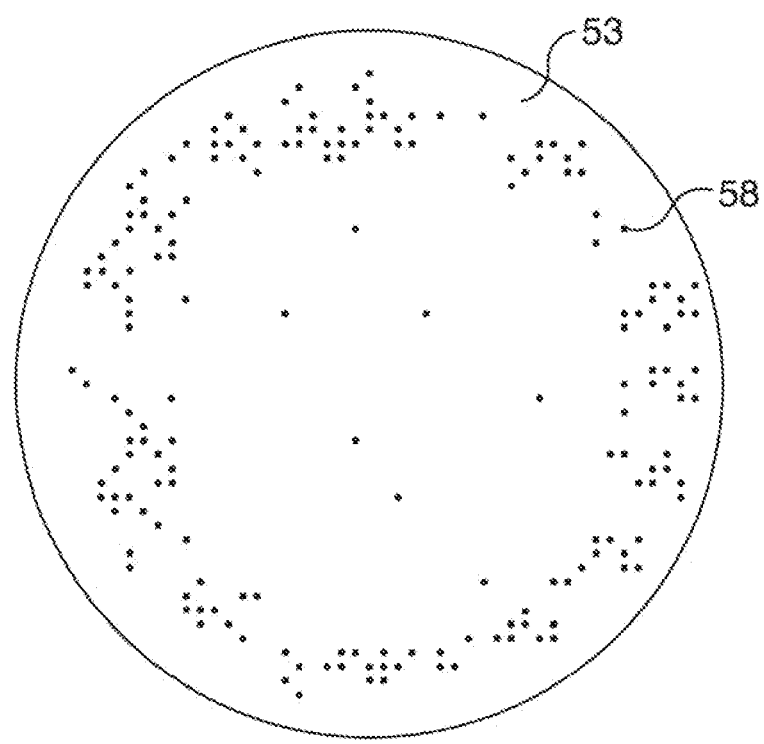
FIG. 13 is a view showing a result of a cleaning using the conventional cleaning apparatus.
Figure 14A:
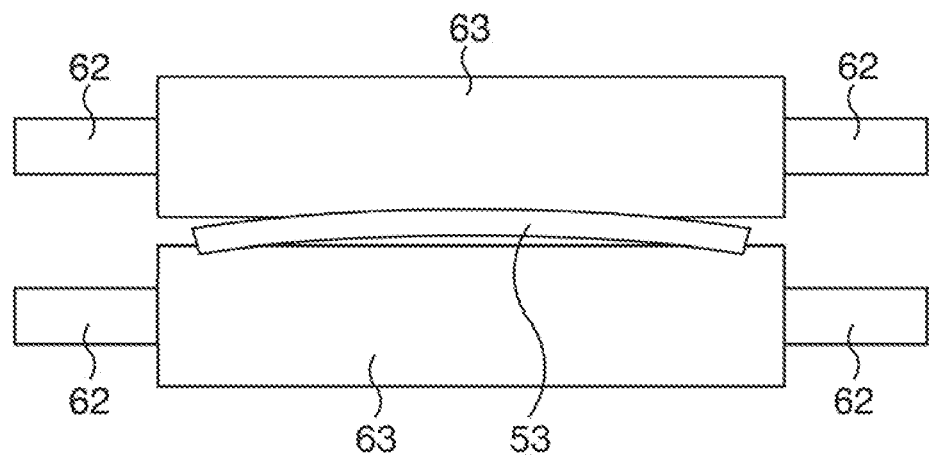
FIG. 14A is a view showing a problem in a conventional cleaning method.
Figure 14B:
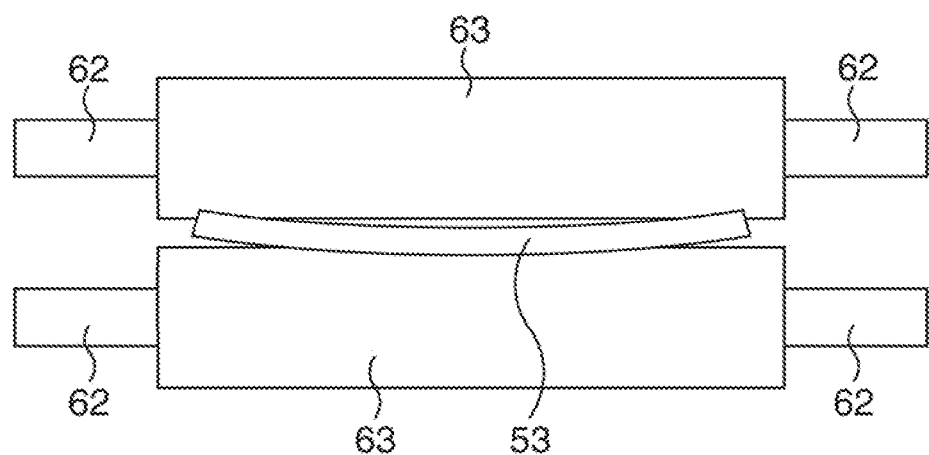
FIG. 14B is a view showing a problem in the conventional cleaning method as well.

In the second embodiment, a front surface cleaning brush 13a is constituted with three front surface cleaning brush pieces 13a-1, 13a-2 and 13a-3 as shown in FIG. 7. Also, a rear surface cleaning brush 13b is constituted with three rear surface cleaning brush pieces 13b-1, 13b-2 and 13b-3. These brush pieces are made of synthetic resin such as PVA (Poly Vinyl Alcohol), for example, on surfaces of which a plurality of projections are formed. One shaft 12 is inserted to the three front surface cleaning brush pieces 13a-1, 13a-2 and 13a-3, while one shaft 12 is inserted to the three rear surface cleaning brush pieces 13b-1, 13b-2 and 13b-3. Cut-outs 14 are formed on two locations of the shaft 12 as shown in FIG. 8A and FIG. 8B. To the cut-outs 14, disk-shaped stoppers 11 are fixed. A diameter of the stopper 11 is, for example, larger than a diameter of the shaft 12 by about 5 mm to 10 mm.

The other constitution is the same as that of the first embodiment.

In the second embodiment as above, when both ends of the front surface cleaning brush 13a and the rear surface cleaning brush 13b are pressurized by the pressure portions 1, as shown in FIG. 9, only the front surface cleaning brush pieces 13a-1 and 13a-3 and the rear surface cleaning brush pieces 13b-1 and 13b-3, which are located on the both ends, are compressed, and the diameters thereof become large. As a consequence, the entire front surface of the wafer 21 is made to contact the front surface cleaning brush 13a substantially evenly, even if the wafer 21 is warped into a shape of a mound. Therefore, a cleaning efficiency of the outer peripheral portion of the wafer 21 improves. Additionally, compared with the first embodiment, the cleaning efficiency is higher since deformations concentrate in the portions contacting the outer peripheral portion of the wafer 21.

In the second embodiment, if the brush piece is required to be exchanged, it is only necessary to detach the stopper 11. Therefore, it is possible to easily cope with various kinds of warp directions and warp amounts of the wafer by using a conventional brush whose diameter is uniform in a longitudinal direction as the brush piece and combining them.

Incidentally, in the first and the second embodiments, the constitution in which the cleaning is performed with the wafer 21 being kept horizontal is adopted, but a constitution in which the cleaning is performed with the wafer 21 being kept vertical may be adopted. Also, an ultra sonic cleaning unit may be provided in a prior step of a brushing, or in the cleaning/drying unit.

According to the present invention, since the diameters of the both end portions of the front surface cleaning brush is enlarged by the application of the pressure, the front surface cleaning brush can be made evenly contact the entire front surface of the wafer even if the wafer is warped. Consequently, a high cleaning efficiency can be achieved even without using various kinds of brushes, so that cleaning of various wafers can be performed reliably.

The present embodiments are to be considered in all respects as illustrative and no restrictive, and all changes which come within the meaning and range of equivalency of the claims are therefore intended to be embraced therein. The invention may be embodied in other specific forms without departing from the spirit or essential characteristics thereof.

What is claimed is:

1. A cleaning method for a wafer, comprising:
    contacting a front surface of the wafer with a straight-shaped front surface cleaning brush, the front surface cleaning brush rotating with a first shaft being an axis, and contacting a rear surface of the wafer with a straight-shaped rear surface cleaning brush, the rear surface cleaning brush rotating with a second shaft being an axis; and
    applying a first pressure on the front surface cleaning brush from both ends to enlarge the diameters in both end portions of the front surface cleaning brush, and applying a second pressure on the rear surface cleaning brush from both ends to enlarge the diameters in both end portions of the rear surface cleaning brush, the first pressure applied on the front surface cleaning brush being a pressure applied parallel to the first shaft, and the second pressure applied on the rear surface cleaning brush being a pressure applied parallel to the second shaft,
    wherein an inner surface of the front surface cleaning brush is directly in contact with a surface of the first shaft,
    wherein the front surface cleaning brush is composed of at least one single structure made of synthetic resin in a radial direction,
    wherein the first pressure applied on the front surface cleaning brush and the second pressure applied on the rear surface cleaning brush are adjusted based on a direction of a warp of the wafer,
    wherein the second pressure applied on the rear surface cleaning brush is smaller than the first pressure applied on the front surface cleaning brush in a case where the wafer is warped as convexed toward the front surface side, and
    wherein the first pressure applied on the front surface cleaning brush is smaller than the second pressure applied on the rear surface cleaning brush in a case where the wafer is warped as convexed toward the rear surface side.

2. The cleaning method for the wafer according to claim 1, wherein the front surface cleaning brush is constituted by combining three or more front surface cleaning brush pieces disposed on a line, each of the front surface cleaning brush pieces being composed of a single structure made of said synthetic resin in the radial direction.

3. The cleaning method for the wafer according to claim 1, wherein a brush made of synthetic resin is used as the rear surface cleaning brush.

4. The cleaning method for the wafer according to claim 1, wherein the rear surface cleaning brush is constituted by combining three or more rear surface cleaning brush pieces disposed on a line.

5. The cleaning method for the wafer according to claim 1, further comprising supplying an alkaline chemical solution to the front surface of the wafer.

6. A manufacturing method for a semiconductor device, comprising:
    contacting a front surface of the wafer with a straight-shaped front surface cleaning brush, the front surface cleaning brush rotating with a first shaft being an axis, and contacting a rear surface of the wafer with a straight-shaped rear surface cleaning brush, the rear surface cleaning brush rotating with a second shaft being an axis; and
    cleaning the wafer while applying a first pressure on the front surface cleaning brush from both ends to enlarge the diameters in both end portions of the front surface cleaning brush, and applying a second pressure on the rear surface cleaning brush from both ends to enlarge the diameters in both end portions of the rear surface cleaning brush, the first pressure applied on the front surface cleaning brush being a pressure applied parallel to the first shaft, and the second pressure applied on the rear surface cleaning brush being a pressure applied parallel to the second shaft, wherein an inner surface of the front surface cleaning brush is directly in contact with a surface of the first shaft, wherein the front surface cleaning brush is composed of a single structure made of synthetic resin, wherein the first pressure applied on the front surface cleaning brush and the second pressure applied on the rear surface cleaning brush are adjusted based on a direction of a warp of the wafer, wherein the second pressure applied on the rear surface cleaning brush is smaller than the first pressure applied on the front surface cleaning brush in a case where the wafer is warped as convexed toward the front surface side, and wherein the first pressure applied on the front surface cleaning brush is smaller than the second pressure applied on the rear surface cleaning brush in a case where the wafer is warped as convexed toward the rear surface side.

7. A manufacturing method for a semiconductor device, comprising:

contacting a front surface of the wafer with a straight-shaped front surface cleaning brush, and contacting a rear surface of the wafer with a straight-shaped rear surface cleaning brush; and cleaning the wafer while applying a first pressure on the front surface cleaning brush from both ends to enlarge the diameters in both end portions of the front surface cleaning brush, and applying a second pressure on the rear surface cleaning brush from both ends to enlarge the diameters in both end portions of the rear surface cleaning brush, the first pressure applied on the front surface cleaning brush being a pressure applied parallel to a first shaft of the front surface cleaning brush, and the second pressure applied on the rear surface cleaning brush being a pressure applied parallel to a second shaft of the rear surface cleaning brush, wherein the first pressure applied on the front surface cleaning brush and the second pressure applied on the rear surface cleaning brush are adjusted based on a direction of a warp of the wafer, wherein the second pressure applied on the rear surface cleaning brush is smaller than the first pressure applied on the front surface cleaning brush in a case where the wafer is warped as convexed toward the front surface side, and wherein the first pressure applied on the front surface cleaning brush is smaller than the second pressure applied on the rear surface cleaning brush in a case where the wafer is warped as convexed toward the rear surface side.

* * * * *